United States Patent [19]
Davies et al.

[11] Patent Number: 6,084,269
[45] Date of Patent: Jul. 4, 2000

[54] SEMICONDUCTOR DEVICE AND METHOD OF MAKING

[75] Inventors: Robert B. Davies, Tempe; Chandrasekhara Sudhama, Phoenix, both of Ariz.

[73] Assignee: Motorola, Inc., Schaumburg, Ill.

[21] Appl. No.: 09/218,368

[22] Filed: Dec. 21, 1998

[51] Int. Cl.$^7$ .................. H01L 29/167; H01L 29/207
[52] U.S. Cl. .................. 257/345; 257/349; 257/404; 438/207; 438/217; 438/289
[58] Field of Search .................. 257/345, 349, 257/344, 404, 401; 438/207, 217, 284

[56] References Cited

U.S. PATENT DOCUMENTS

| | | |
|---|---|---|
| 4,198,252 | 4/1980 | Hsu . |
| 4,371,955 | 2/1983 | Sasaki . |
| 4,545,109 | 10/1985 | Reichert . |
| 4,697,198 | 9/1987 | Komori et al. . |
| 4,796,070 | 1/1989 | Black . |
| 5,021,845 | 6/1991 | Hashimoto . |
| 5,384,476 | 1/1995 | Nishizawa ........................ 257/345 |
| 5,395,773 | 3/1995 | Ravindhran et al. . |
| 5,434,093 | 7/1995 | Chau et al. . |
| 5,512,770 | 4/1996 | Hong ........................ 257/345 |
| 5,548,154 | 8/1996 | Miller . |
| 5,559,357 | 9/1996 | Krivokapic ........................ 257/336 |
| 5,583,361 | 12/1996 | Morishita ........................ 257/345 |
| 5,600,168 | 2/1997 | Lee . |
| 5,656,842 | 8/1997 | Iwamatsu et al. . |
| 5,895,954 | 4/1999 | Yasumura et al. ........................ 257/345 |

FOREIGN PATENT DOCUMENTS

| 2-1173 | 1/1990 | Japan ........................ 257/345 |

OTHER PUBLICATIONS

H. Lin et al., "Computer Analysis of the Double–Diffused MOS Transistor for Integrated Circuits," Transactions on Electron Devices, vol. Ed–20, No. 3, Mar. 1973, pp. 275–282.

S. Shimizu et al., "0.15$\mu$m CMOS Process for High Performance and High Reliability,"IEEE 1994, San Francisco, CA, pp. 67–70.

K. Lee et al., "Room Temperature 0.1 $\mu$m CMOS Technology with 11.8 ps Gate Delay," IEEE 1993, Washington, DC, pp. 131–134.

*Primary Examiner*—Donald L. Monin, Jr.

[57] ABSTRACT

A graded-channel semiconductor device (10) is formed in a pedestal (12). The pedestal (12) is formed on a substrate (11) and improves the electrical characteristics of the device (10) compared to conventional device structures. The pedestal (12) has sides (13) that are bordered by a dielectric layer (24) to provide electrical isolation. The semiconductor device (10) includes a drain extension region (101) that extend from a drain region (44) to a gate structure (20). The semiconductor device (10) also has a conductive structure (105) that is adjacent to the gate structure (20).

21 Claims, 9 Drawing Sheets

SEMICONDUCTOR DEVICE AND METHOD OF MAKING

BACKGROUND OF THE INVENTION

This invention relates, in general, to insulated gate field effect transistors, and more particularly to short channel insulated gate field effect transistors.

Semiconductor devices such as insulated gate field effect transistor (IGFET) devices are becoming increasingly important in low voltage applications. As IGFET devices are scaled to smaller and smaller dimensions, manufacturers must refine transistor designs to maintain optimum device performance. Typically, in IGFET devices having channel lengths in the sub-micron range, manufacturers must carefully fabricate drain regions to avoid performance degradation problems such as hot carrier injection, drain leakage, punch-through, and the like.

In IGFET devices having channel lengths of about one micron, many device performance problems can be corrected by forming a lightly-doped-drain (LDD) region. The LDD region acts to lower the electric field in the channel region near the drain region. This reduced electric field improves threshold voltage stability by reducing hot carrier injection into the gate oxide layer overlying the channel region. However, the LDD region causes a reduction in performance because of an increase in source resistance, which negatively impacts transconductance. Also, as the channel length approaches 0.5 microns and below, drain engineering techniques (e.g., LDD regions) are not as effective in preventing performance degradation.

Additionally, manufacturers have used counter-doped source and drain regions to reduce sub-surface punch-through in short channel devices. These counter-doped regions are often referred to as "halo" regions. Although the halo regions are effective in reducing punch-through, they decrease carrier mobility in the channel region thereby degrading drive current. Also, the halo regions increase junction capacitance, which degrades switching speed performance.

Another approach to preventing performance degradation includes placing a higher doped region in the channel region between the source and drain region and extending from the surface down into the bulk semiconductor material. This higher doped region is of the same conductivity type as the channel region. Although this approach is effective in reducing punch-through, it also decreases carrier mobility in the channel region, which degrades drive current. In an alternative but similar approach, the higher doped region is placed in the channel region below the surface and contacting both the source region and the drain region. This alternative approach improves drive current capability but suffers from reduced breakdown voltage performance and a higher junction capacitance, which in turn degrades switching performance.

As is readily apparent, structures and methods are needed that overcome at least the above problems found in the prior art. It would be advantageous to manufacture such structures in a cost effective and reproducible manner. Additionally, it would be of further advantage if such structures could operate at relatively low voltages and still offer high breakdown voltage capability.

DETAILED DESCRIPTION OF THE DRAWINGS

In general, the present invention relates to a graded-channel semiconductor device suitable for sub-micron channel length designs. The device includes a source region and a drain region formed in a body of semiconductor material, with the body of semiconductor material being of opposite conductivity. The body of semiconductor material is first formed into a pedestal structure to improve the electrical characteristics of the graded-channel semiconductor device. In addition, the device has a drain extension region formed between the channel region and the drain region to improve the breakdown voltage of the device.

The method for forming the graded-channel semiconductor device as described below allows a device to be formed that has an effective channel length that is smaller than the minimum geometries that are possible using conventional photolithographic techniques. The device also exhibits improved performance characteristics compared to prior art structures.

Figure 1:
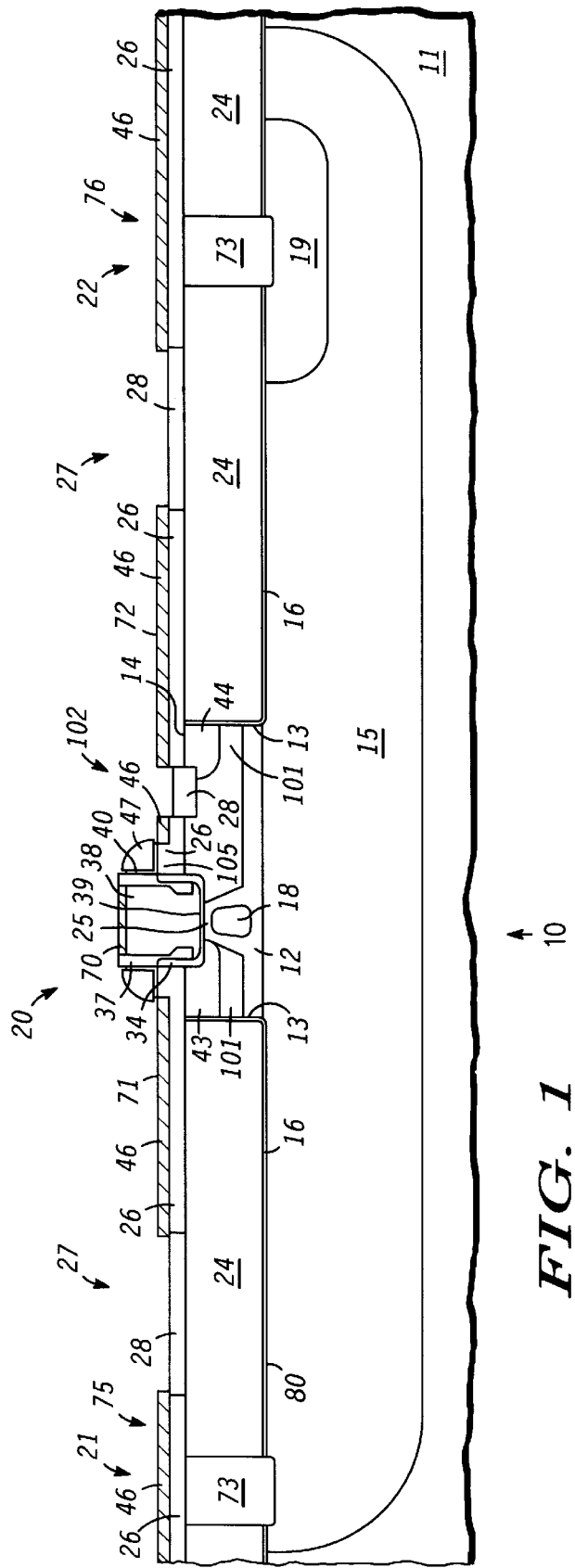
FIGS. 1–8 illustrate enlarged cross-sectional views of a graded-channel semiconductor device at various stages of fabrication in accordance with the present invention.

Turning now to the drawings to provide a more detailed description, FIG. 1 is provided to illustrate the features of a graded-channel semiconductor device, a semiconductor device, or a device 10 according to the present invention. For purposes of this description, device 10 is an n-channel IGFET device. This is intended as an example only and as those skilled in the art will appreciate, the present invention applies also to p-channel devices. Alternatively, the structure according to the present invention applies to complementary p-channel/n-channel configurations as well.

Device 10 is a semiconductor device formed in a semiconductor substrate 11 and comprises a gate structure 20. Gate structure 20 is used to modulate a channel 25 between a source region 43 and a drain region 44. A significant feature of device 10 is that source region 43 and drain region 44 are formed in a body of semiconductor material that is arranged as a pedestal 12 as shown in FIG. 1. Because portions of device 10 are formed in pedestal 12, many of the electrical characteristics of device 10 are improved. For example, the physical isolation provided to device 10 by pedestal 12 reduces the effects of leakage currents and voltage potentials that may be present in the underlying substrate 11. In addition, semiconductor device 10 also has a drain extension region 101 that physically separates drain region 44 from channel 25. As a result, the breakdown voltage is improved and the effects of parasitic bipolar structures are significantly reduced.

Device 10 also has a doped region 18, which is used to improve the punch-through resistance between source region 43 and drain region 44. Doped region 18 is formed below a major surface 14 of pedestal 12 and has a varying dopant concentration throughout as described below to maximize the ability of doped region 18 to prevent punch-through and to adjust the threshold voltage of device 10.

As shown in FIG. 1, device 10 further comprises a buried interconnect region 19, a plug contact 21, and a plug contact 22. These structures are used as part of an optional interconnect structure to provide electrical connections for device 10 or neighboring device structures (not shown). The interconnect structure can also be used to electrically couple voltages to substrate 11 or to various doped regions formed in substrate 11.

A more detailed description of the composition and function of elements of device 10 as shown in FIG. 1 is now provided. Device 10 includes a semiconductor substrate, a body of semiconductor material, or substrate 11, which can comprise a semiconductor layer, a diffused well, a substrate region, or an epitaxial layer. For an n-channel device, substrate 11 typically comprises a lightly doped epitaxial layer on a heavily doped substrate. The epitaxial layer having a boron doped (i.e., p-type conductivity) concentration having a background dopant concentration typically in a range from about $1.5 \times 10^{15}$ atoms/$cm^3$ to about $2.0 \times 10^{16}$ atoms/$cm^3$. Methods for forming substrate 11 are well known.

Device 10 also includes source region 43 and drain region 44 that extend from major surface 14 to a depth of about 0.1 microns to about 0.3 microns. Source region 43 and drain region 44 are n-type conductivity regions having a surface concentration on the order of $1.0 \times 10^{20}$ atoms/$cm^3$. Drain extension region 101 is also of n-type conductivity and has a surface concentration on the order of $2.0 \times 10^{17}$ atoms/$cm^3$. Source region 43 and drain extension region 101 are, for example, spaced apart a distance in a range from about 0.25 microns to 0.5 microns to provide a relatively short channel region 25. As photolithographic techniques evolve to economically produce smaller dimensions, this distance is scaleable according to classic metal-oxide semiconductor (MOS) scaling techniques.

Gate structure 20 of device 10 is formed adjacent to channel region 25 and includes, for example, a region of conductive material 38 electrically insulated from channel region 25 by gate dielectric layer 39. Gate dielectric layer 39 preferably comprises an oxide and has a thickness in a range from about 20 angstroms to about 100 angstroms. To modulate channel region 25, a voltage potential is placed on conductive material 38 using a gate electrode 70. Gate electrode 70 is formed from a conductive material, which improves the electrical characteristics of conductive material 38.

A portion of conductive material 38 overlaps at least a portion of the junction formed by source region 43 and pedestal 12 and at least a portion of the junction formed by drain extension region 101 and pedestal 12. By overlapping a portion of source region 43 and drain extension region 101, gate control of gate structure 20 is effective across channel region 25. This also significantly enhances device reliability and manufacturability. Insufficient overlap results in erratic manufacturing yields and degrades device performance.

Gate structure 20 also includes a thermal oxide layer 34 and spacers 37, which are used to provide physical and electrical isolation between gate electrode 70 and electrodes 71 and 72. Electrodes 71 and 72 are electrically coupled to source region 43 and drain region 44 respectively. In addition, FIG. 1 illustrates the use of spacers 47, which are formed to prevent bridging of silicide between gate electrode 70 and electrodes 71 and 72.

According to the present invention, a doped region 18 is formed in channel region 25 and is preferably vertically spaced apart from (i.e., it does not directly contact) major surface 14. Additionally, doped region 18 is both vertically and laterally spaced apart from source region 43 and drain extension region 101. Further, the lateral extent of doped region 18 is defined independently of the distance between source region 43 and drain extension region 101.

Doped region 18 is of the same conductivity type as pedestal 12, but has a higher dopant concentration. Additionally, doped region 18 extends into pedestal 12 to a depth greater than about 0.3 microns. Preferably, doped region 18 has a dopant concentration greater than or equal to approximately $3.0 \times 10^{17}$ atoms/$cm^3$ (i.e., doped region 18 preferably has a dopant concentration at least an order magnitude greater than the background concentration of pedestal 12). Preferably, doped region 18 is also at least 125 angstroms below major surface 14 with a distance of about 800 angstroms preferred. According to the present invention, the distance that doped region 18 is spaced from major surface 14 contributes to establishing the threshold voltage of graded-channel semiconductor device 10.

Doped region 18 provides a localized area of charge that functions, among other things, to enhance punch-through resistance. Also, because doped region 18 is spaced apart from source region 43 and drain extension region 101, device 10 exhibits improved breakdown voltage characteristics, improved switching speeds due to reduced junction capacitance, and improved resistance to hot-carrier injection effects compared to prior art structures where the center doped region contacts the source and drain regions. Additionally, because doped region 18 is spaced apart from major surface 14, device 10 exhibits a lower threshold voltage and improved drive capability (i.e., higher transconductance) compared to prior art structures having substantially constant channel doping in the center of the channel that extends all the way to the surface (i.e., extends completely to the surface of the channel region).

The location of doped region 18 and thickness of gate dielectric layer 39 can be varied to produce devices with various characteristics. For example, with doped region 18 spaced a distance of about 1,125 angstroms from major surface 14 and with gate dielectric layer 39 having a thickness of about 90 angstroms, device 10 exhibits a leakage current (Idss) on the order of 40 nano-amps/micron (at a Vds of 1.8 volts), a threshold voltage on the order of 165 millivolts, a peak transconductance on the order of 65 Siemens/meter, a drive current (Idsat) on the order of 790 micro-amps/micron (at a Vds of 3.3 volts), 555 micro-amps/micron (at a Vds of 2.5 volts), and a breakdown voltage (BVdss) on the order of 7.5 volts.

With doped region 18 spaced a distance of about 800 angstroms from major surface 14 and with gate dielectric layer 39 having a thickness of about 90 angstroms, graded-channel device 10 exhibits an Idss on the order of 1.0 nano-amp/micron (at a Vds of 1.8 volts), a threshold voltage on the order of 300 millivolts, a peak transconductance on the order of 60 Siemens/meter, an Idsat on the order of 730 micro-amps/micron (at a Vds of 3.3 volts), an Idsat on the order of 500 micro-amps/micron (at a Vds of 2.5), and a BVdss on the order of 8.0 volts.

With doped region 18 spaced a distance of about 150 angstroms from major surface 14 and with gate dielectric layer 39 having a thickness of about 90 angstroms, graded-channel device 10 exhibits an Idss on the order of 1.0 pico-amp/micron (at a Vds of 1.8 volts), a threshold voltage on the order of 575 millivolts, a peak transconductance on the order of 53 Siemens/meter, an Idsat on the order of 620 micro-amps (at a Vds of 3.3 volts), an Idsat on the order of 400 micro-amps/micron (at a Vds of 2.5 volts), and a BVdss on the order of 8.25 volts. All of the above examples are drawn with dimensions such that the width of gate structure 20 is about 0.5 microns.

In contrast to the above examples, comparable prior art structures having a 0.5 micron drawn gate dimension and a 90 angstrom gate oxide typically exhibit Idsat values on the order of 400 micro-amps/micron at 3.3 volts and an Idss of about 1.0 nano-amp/micron. Comparable prior art structures having a 0.35 micron drawn gate length and a 90 angstrom gate oxide typically exhibit Idsat values on the order of 450 micro-amps/micron at 2.5 volts and an Idss of about 1.0 nano-amp/micron. As is readily apparent, device 10 featuring 1.0 nano-amp/micron Idss capability also shows a significant improvement in Idsat compared to the prior art structures.

Dielectric layer 24 is used to provide electrical and physical isolation between various elements of FIG. 1. For example, dielectric layer 24 electrically isolates source region 43 and drain region 44 from any neighboring device structures. Dielectric layer 24 is also used to provide electrical isolation as part of the interconnect structure of the present invention as will become more apparent with the description to follow.

Also shown in FIG. 1 are portions of an interconnect structure that can be optionally formed in conjunction with device 10 of the present invention or with many conventional semiconductor device structures. Plug contact 21 comprises a plug region 73, which is used to provide electrical coupling between well region 15 and a contact electrode 75. Plug contact 22 also comprises a plug region 73, which is used to electrically couple buried interconnect region 19 to a contact electrode 76. It should also be understood that plug contacts 21 or 22 could also be used to electrically couple a contact electrode (not shown) to substrate 11 and that plug contacts 21 and 22 are used to pass voltage levels or electronic signals through a dielectric layer 24.

Figure 2:
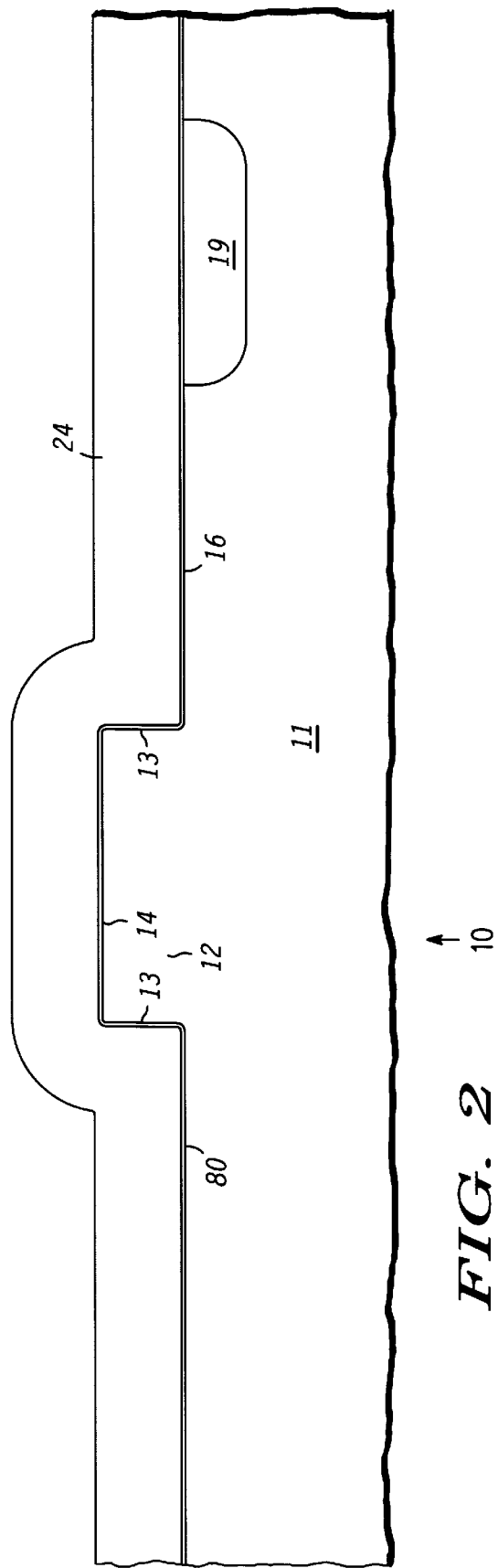

Turning now to FIGS. 2–8, a preferred method for forming device 10 is described. During the description pertaining to the formation of device 10, details will be provided on how to form portions of an interconnect structure. These details illustrate how the formation of the interconnect structure can be integrated into the process flow of device 10. FIG. 2 illustrates an enlarged cross-sectional view of substrate 11 at an early stage of processing. The upper portion of substrate 11 is preferably a lightly doped p-type body of silicon and may be formed by a lightly doped p-type layer on a heavily doped p-type substrate. The formation of device 10 begins with the formation of pedestal 12.

A masking layer (not shown) is patterned on substrate 11, which acts as a hard mask to define pedestal 12. Preferably, the masking layer is an 800 angstrom to 2,000 angstrom thick film of silicon dioxide that is grown on substrate 11 and patterned using a photolithographic process. A timed reactive ion etch (RIE) is used to remove the portions of substrate 11 that are not covered by the masking layer. Pedestal 12 is the remaining raised portion of substrate 11 that is covered by the masking layer. Pedestal 12 is elevated about 3,000 angstroms to 10,000 angstroms above a surface 80 of substrate 11 and is about 5,000 angstroms to 60,000 angstroms wide. The width of pedestal 12 is defined as the distance between the sides 13 of pedestal 12 as shown in FIG. 2. Pedestal 12 further comprises a major surface 14 on which portions of device 10 will be formed.

Following the removal of the masking layer, a thermal oxide layer 16 with a thickness of about 100 angstroms to 500 angstroms is grown on surface 80, sides 13, and major surface 14. If desired, a photolithographic masking step, an implant step, and an anneal step can be performed to form the optional buried interconnect region 19 as shown in FIG. 2. An arsenic implant dose on the order of $1.0 \times 10^{15}$ atoms/cm$^2$ to $1.0 \times 10^{16}$ atoms/cm$^2$ and an implant energy on the order of 80 keV is suitable for forming buried interconnect region 19. Following the formation of buried interconnect region 19, dielectric layer 24 is deposited onto surface 80, sides 13, and major surface 14. Preferably, dielectric layer 24 is deposited using well known deposition techniques (e.g., low pressure chemical vapor deposition (CVD), plasma enhanced CVD, etc.) and comprises a material such as silicon dioxide formed from the decomposition of tetraethylorthosilicate (TEOS). Dielectric layer 24 is about 4,000 angstroms to 13,000 angstroms thick and should be thick enough to cover sides 13 of pedestal 12.

Figure 3:
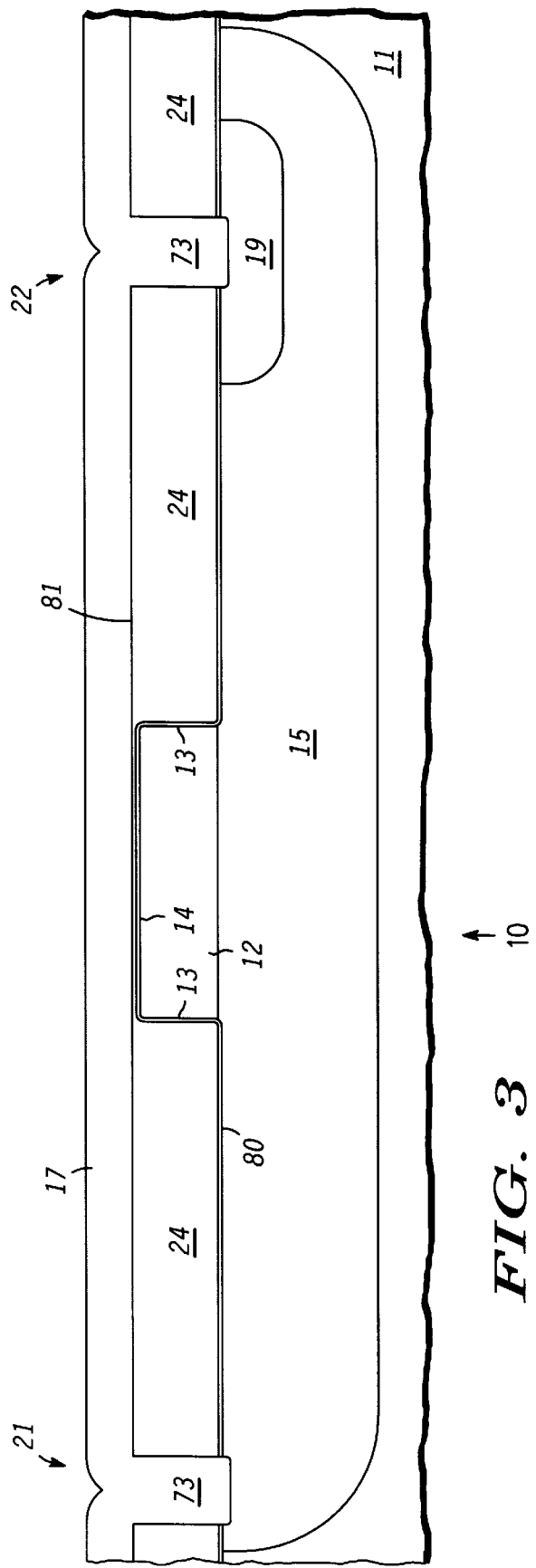

Referring now to FIG. 3, dielectric layer 24 is then planarized to provide a planar surface 81. Dielectric layer 24 can be planarized with either a chemical mechanical polishing (CMP) technique or a photolithographic negative-layer (n-layer) process, both of which are well known. The planarizing process preferably leaves a portion of dielectric layer 24 and thermal oxide layer 16 on major surface 14 of pedestal 12. It should also be understood that all of dielectric layer 24 and thermal oxide layer 16 can be removed from major surface 14 during the planarizing process. Well region 15 is then formed by implanting substrate 11 through planar surface 81 and is used to prevent the electrical inversion of surface 80 between device 10 and possible surrounding devices not shown. A boron implant dose on the order of $1.0 \times 10^{12}$ atoms/cm$^2$ to $2.0 \times 10^{13}$ atoms/cm$^2$ and an implant energy on the order of 250 keV is suitable for forming well region 15.

Still referring to FIG. 3, as part of the interconnect structure of the present invention, openings may be optionally formed in dielectric layer 24 for the formation of plug contacts 21 and 22. Again, the formation of the interconnect structure is not required for the formation of device 10. A photolithographic masking pattern (not shown) is used to expose the portions of dielectric layer 24 where plug contacts 21 and 22 are formed. An RIE etch is then used to remove the exposed portions of dielectric layer 24 and expose portions of the underlying well region 15 and buried interconnect region 19.

A coupling layer 17 is then formed on planar surface 81 and in the openings of plug contacts 21 and 22 as shown in FIG. 3. Coupling layer 17 is made from a conductive material and is used primarily to form plug regions 73. Plug regions 73 are used in plug contacts 21 and 22 to electrically couple to well region 15 and buried interconnect region 19 respectively. Coupling layer 17 can comprise a variety of conductive materials such as polysilicon, doped silicon, tungsten, cobalt, chromium, or the like. Such materials can be deposited using a CVD process, a plasma enhanced chemical vapor deposition (PECVD) process, or by a sputtering process.

Figure 4:
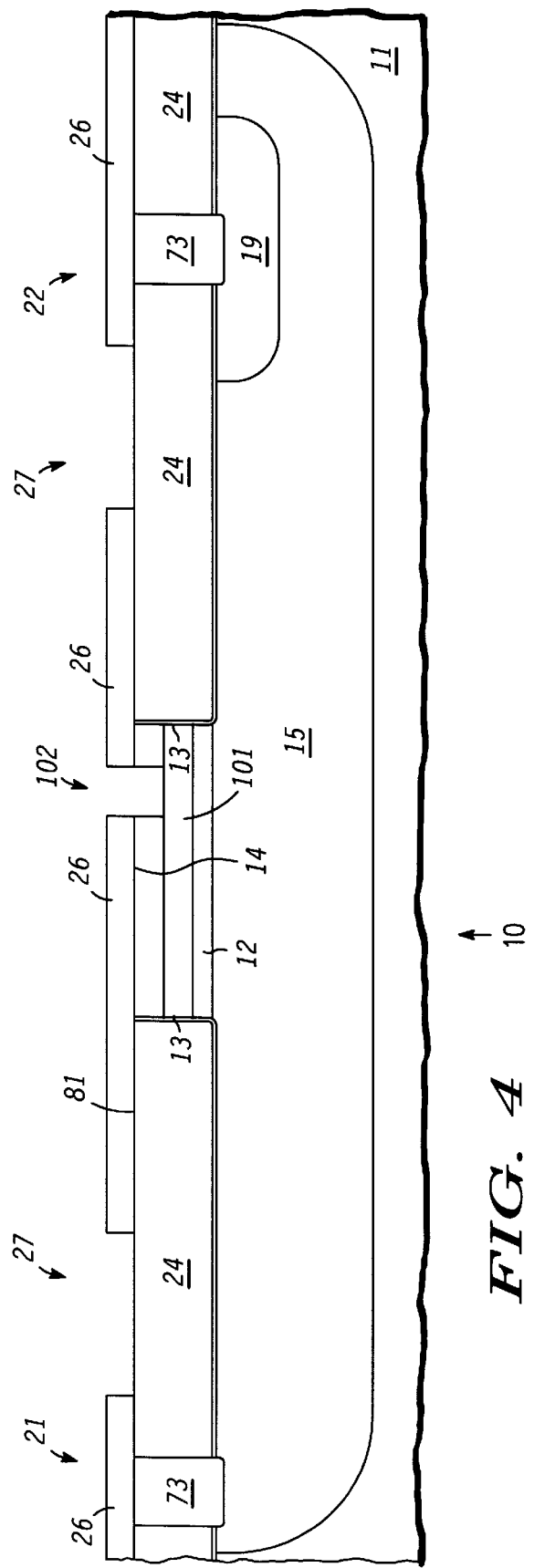

Referring now to FIG. 4, the portions of coupling layer 17 on planar surface 81 and over major surface 14 have been removed with either an etch or a CMP process. This will electrically isolate each of plug regions 73 from each other. Any remaining portions of dielectric layer 24 or thermal oxide layer 16 on major surface 14 of pedestal 12 are then also removed.

Drain extension region 101 is formed using a photolithographic pattern and ion implantation step. A photolithographic mask (not shown) is formed so that pedestal 12 is exposed. An n-type dopant such as phosphorus is implanted through the mask to form drain extension region 101. For example, a phosphorus implant dose on the order of $1.0 \times 10^{12}$ atoms/cm$^2$ to $1.0 \times 10$ atoms/cm$^2$ and an implant energy on the order of 150 keV is suitable for forming drain extension region 101. The photolithographic mask is removed to allow further processing.

A polysilicon layer 26 is then deposited onto major surface 14 and planar surface 81. Polysilicon layer 26 is about 500 angstroms to 2,000 angstroms thick and is in direct physical contact with the silicon material of pedestal 12. Polysilicon layer 26 is also in contact with plug regions 73 of plug contacts 21 and 22. A photolithographic masking pattern (not shown) and an RIE etch process are used to remove portions of polysilicon layer 26 to electrically isolate the portion of polysilicon layer 26 over pedestal 12 from the portions of polysilicon layer 26 over plug regions 73. This electrical isolation is shown in FIG. 4 as openings 27. This process also forms an opening 102. As will become more apparent below, opening 27 separates the portion of polysilicon layer 26 that is used to make electrical contact to the drain region from the gate structure of semiconductor device 10. After the formation of openings 27 and 102, the photolithographic mask is removed to allow further processing.

Figure 5:
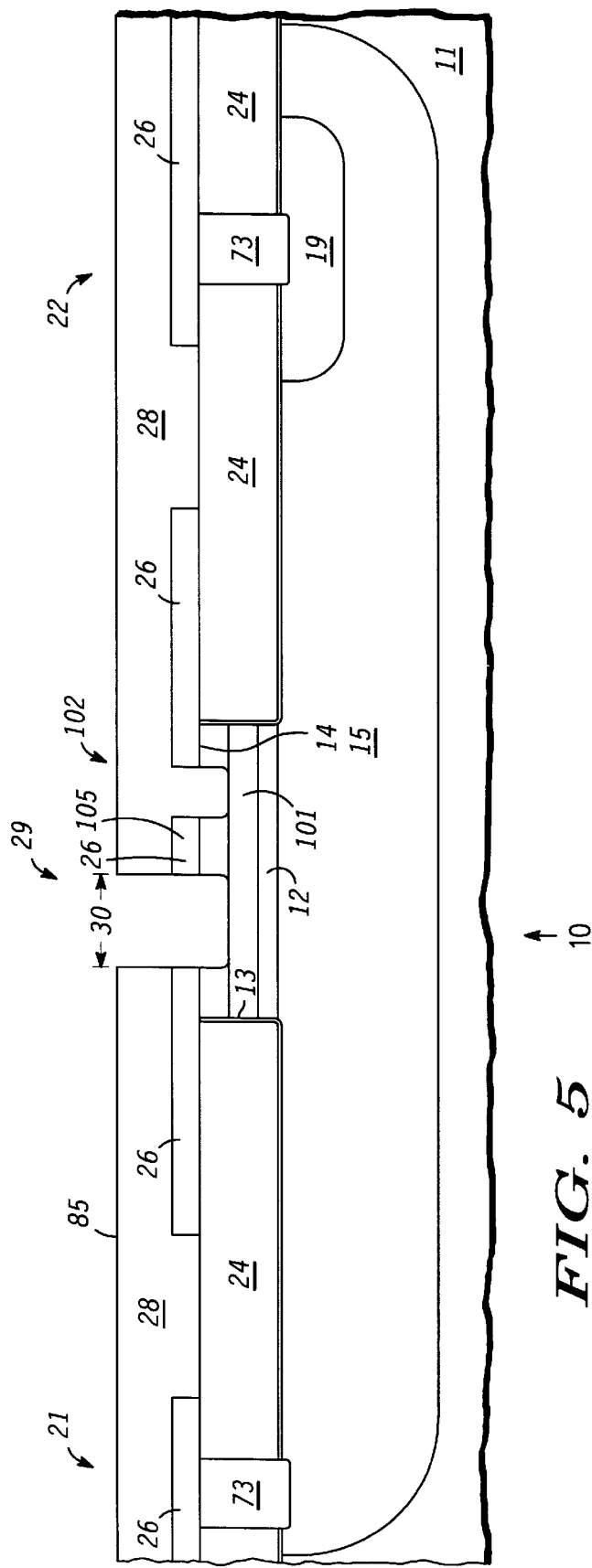

FIG. 5 illustrates substrate 11 at a subsequent step of manufacture. In particular, FIG. 5 shows substrate 11 with a dielectric layer 28 formed on polysilicon layer 26 and the exposed portions of dielectric layer 24. Preferably, dielectric layer 28 is a 4,000 angstrom to 7,000 angstrom thick layer of silicon dioxide that is formed from a CVD deposition process. A planar surface 85 is formed on dielectric layer 28 using a conventional CMP process. Planar surface 85 of dielectric layer 28 is then patterned with a photolithographic pattern (not shown) to form a gate opening 29, which has, for example, a width 30 on the order of 0.4 microns to 0.6 microns. Subsequent reference to the figures and the description will assume that gate opening 29 is 0.5 microns wide. This establishes a drawn gate dimension. Techniques for forming gate opening 29 are well known in the art. As stated above, as photolithographic capabilities evolve to economically produce smaller dimensions, width 30 is scaleable using classic MOS scaling techniques.

To form gate opening 29, a reactive ion etch is used to remove the exposed portions of dielectric layer 28 and polysilicon layer 26. Preferably, the RIE etch process includes a timed over etch so that a portion of pedestal 12 at major surface 14 is also removed. It should also be understood that the RIE etch process can be modified so that a thin portion of polysilicon layer 26 is left in gate opening 29 so no part of pedestal 12 is removed. The formation of gate opening 29 leaves a portion of polysilicon layer 26 on pedestal 12, hereinafter referred to as conductive structure 105. Conductive structure 105 is an inherent result of the process used to form semiconductor device 10 and is preferably formed so as to be as small as the photolithographic techniques can provide. For example, conductive structure 105 is about 0.05 to 0.3 microns wide.

Figure 6:
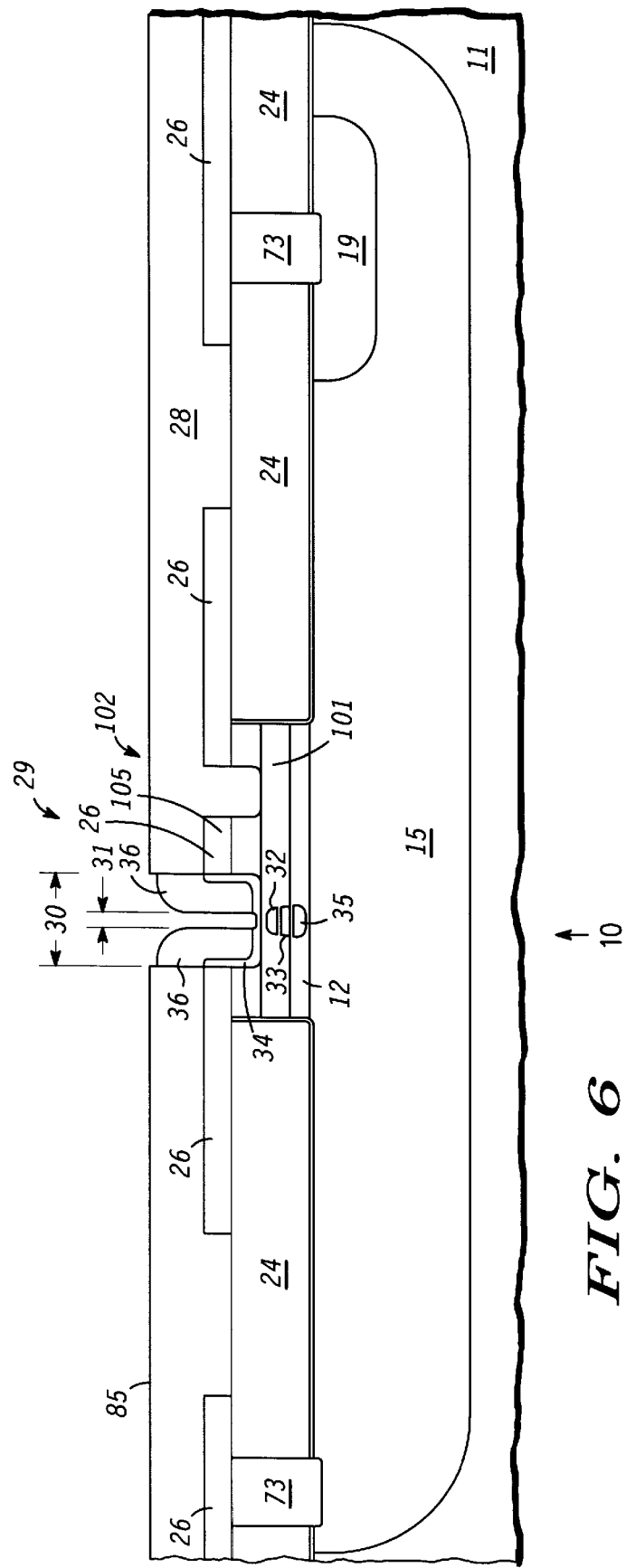

FIG. 6 illustrates device 10 at a subsequent step of manufacture. In particular, FIG. 6 shows substrate 11 after thermal oxide 34 has been formed on the exposed portions of polysilicon layer 26 and major surface 14. Thermal oxide layer 34 is about 100 angstroms to 500 angstroms thick and can be formed by placing substrate 11 into a high temperature, oxidizing ambient. Temporary spacers 36 are then formed by depositing a material such as a polysilicon layer (not shown) onto planar surface 85 and into gate opening 29. The thickness of the polysilicon layer is selected based upon the desired width of each temporary spacer 36 and thus a desired aperture width 31 used to subsequently form doped region 18 (see FIG. 1). For example, to provide an aperture width 31 of about 0.15 microns, the polysilicon layer has a thickness of about 1,750 angstroms. This is based on the well known relationship that aperture width 31 is approximately equal to width 30 minus two times the thickness of the polysilicon layer.

Once the polysilicon layer is formed, the layer is anisotropically etched to form temporary spacers 36 as shown in FIG. 6. The anisotropic etch removes the portions of the polysilicon layer on major surface 14 and provides aperture width 31. The polysilicon layer is etched using, for example, well known reactive ion etching (RIE) techniques. Temporary spacers 36 provide the sub-photolithographic aspect of doped region 18. Alternatively, temporary spacers 36 could be formed using silicon nitride.

Following the formation of temporary spacers 36, doped region 18 (see FIG. 1) is formed preferably using ion implantation and annealing techniques. For a 1.0 nano-amp/micron Idss device, doped region 18 preferably is formed by a series of ion implants including, a first boron implant dose of about $7.0 \times 10^{12}$ atoms/cm$^2$ at an energy of about 80 keV (represented by region 35), a second boron implant dose of about $7.0 \times 10^{12}$ atoms/cm$^2$ at 40 keV (represented by region 33), and a third boron implant dose of about $4.0 \times 10^{11}$ atoms/cm$^2$ at an energy of about 10 keV (represented by region 32).

For a 1.0 pico-amp/micron Idss device, the first and second boron implants are the same as above, but the third boron implant dose is on the order of about $3.0 \times 10^{12}$ atoms/cm$^2$ at an energy of about 10 keV. For a 40 nano-amp/micron Idss device, the first boron implant is the same as above, but the second boron implant is on the order of $7.0 \times 10^{12}$ atoms/cm$^2$ at 50 keV and the third boron implant is not done (i.e., region 32 is not formed). In general, the implant energy is selected for doping regions 32, 33, and 35 so that once regions 32, 33, and 35 are annealed to form doped region 18, doped region 18 is spaced a distance from major surface 14 on the order of at least 125 angstroms.

Figure 7:
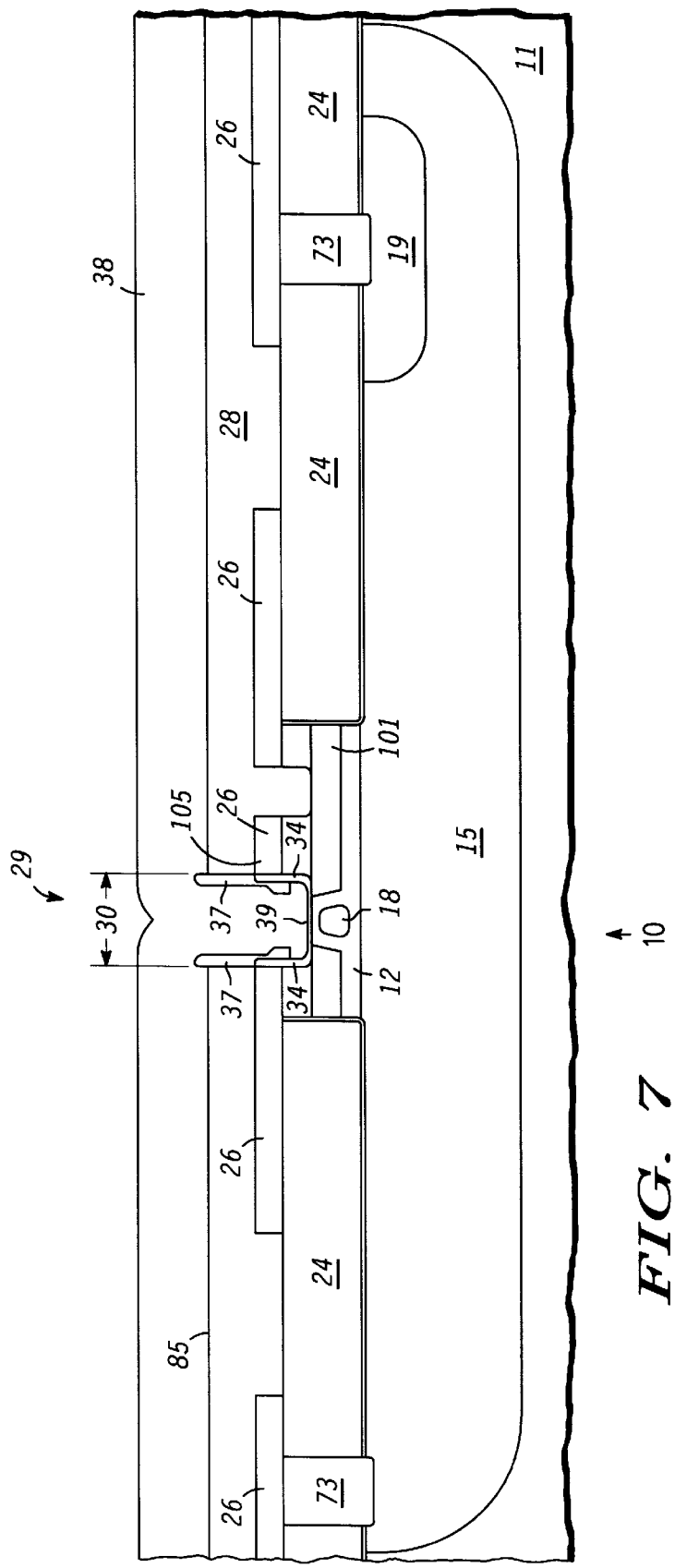

Referring now to FIG. 7, following ion implantation, temporary spacers 36 are removed using well known wet etch techniques. Next, a layer of silicon nitride (not shown) is deposited onto planar surface 85 and into gate opening 29. The layer of silicon nitride is also formed on thermal oxide layer 34 overlying major surface 14. Then the layer of silicon nitride is anisotropically etched to form spacers 37 as shown in FIG. 7. The anisotropic etch removes the layer of silicon nitride on thermal oxide layer 34 over major surface 14. A wet etch is then used to remove the portions of thermal oxide layer 34 that were exposed by the anisotropic etch used to form spacers 37. The wet etch leaves portions of thermal oxide layer 34 between spacers 37 and polysilicon layer 26 on pedestal 12. The wet etch can also remove a portion of pedestal 12 to clean major surface 14 for subsequent processing.

A gate dielectric layer 39 is then formed as shown in FIG. 7. Preferably, gate dielectric layer 39 comprises a thermal oxide and has a thickness on the order of about 20 angstroms to about 100 angstroms (90 angstroms was used for the examples provided above). During the formation of gate dielectric layer 39, regions 32, 33 and 35 are annealed to activate the implanted dopant to form doped region 18. The effect of the p-type dopant of doping regions 32, 33, and 35 in close proximity to the n-type dopant of the drain extension region is demonstrated in FIG. 7. In the portions of overlap, the dopants electrically cancel each other. This is why doped region 18 is shown to be separated from drain extension region 101. In addition, since gate dielectric layer 39 and thermal oxide layer 34 both preferably comprise silicon dioxide, these two layers are shown in FIG. 7 as one layer for clarity.

Following the formation of gate dielectric layer 39, a layer of conductive material 38 is formed over major surface 14, planar surface 85, and into gate opening 29. Conductive layer 38 preferably comprises polysilicon or amorphous silicon and in this example, has a thickness on the order of 4,000 angstroms. This thickness varies depending on width 30 of gate opening 39. Methods for forming layer 38 are well known. It should also be understood that the gate structure of device 10 can be formed from other materials used in the semiconductor industry such as cobalt, tungsten, molybdenum, or the like.

Figure 8:
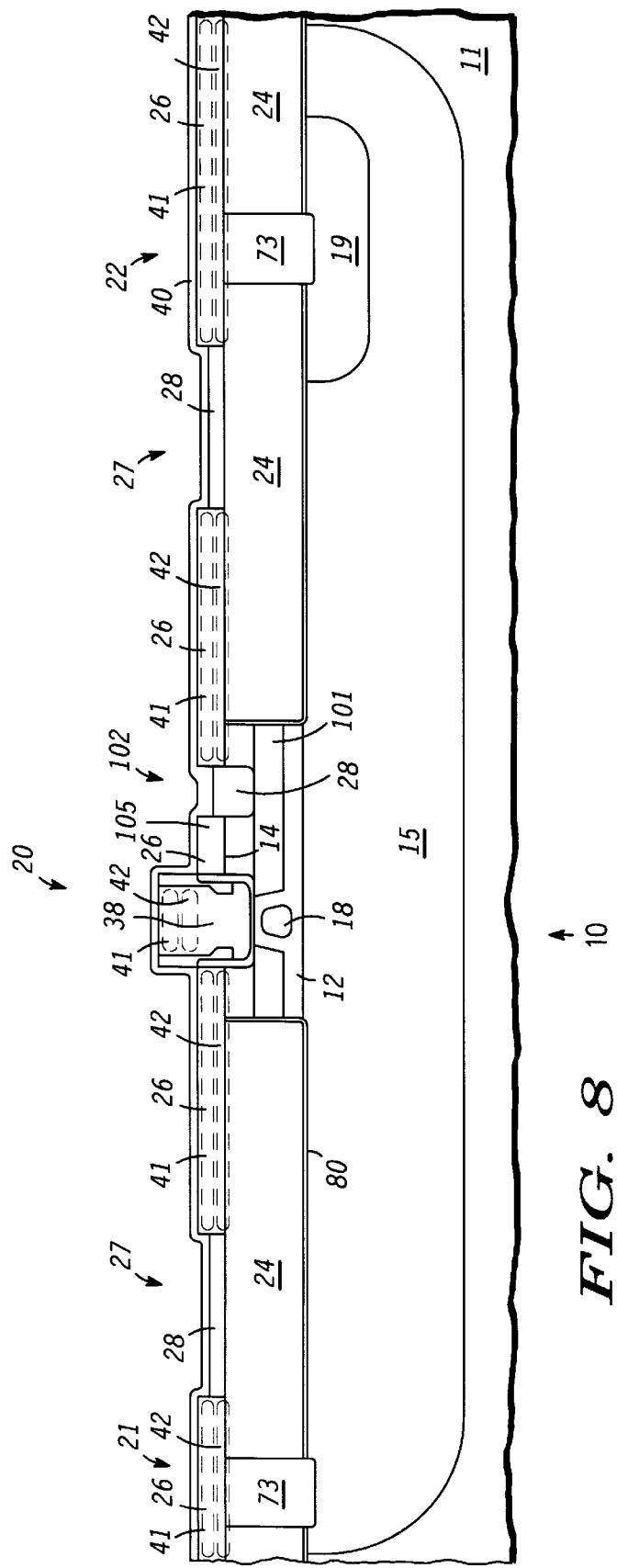

FIG. 8 illustrates device 10 at a subsequent step in manufacture. In particular, FIG. 8 shows substrate 11 after layer 38 has been planarized. For example, layer 38 is planarized using chemical mechanical polishing (CMP) techniques, which are well known. After layer 38 is planarized, a portion of layer 38 remains in gate opening 29 and becomes a portion of gate structure 20 (see FIG. 1). The portion of layer 38 that remains in gate opening 29 typically has a thickness on the order of 3,500 angstroms to 6,000 angstroms.

Following the planarization of layer 38, portions of dielectric layer 28 are removed using, for example, conventional wet etching techniques to form the structure shown in FIG. 8. The portion of dielectric layer 28 overlying gate structure 20 and polysilicon layer 26 is removed. A portion of dielectric layer 28 may be left in openings 27 and 102 as shown in FIG. 8. A dielectric layer 40 is then formed on the exposed surfaces of gate structure 20 and layer of polysilicon 26. Preferably, dielectric layer 40 is about 100 angstroms to 500 angstroms thick and is formed from the chemical vapor deposition of silicon dioxide.

Dielectric layer 40 is used as a screen oxide for the subsequent implant steps used to form doped regions 41 and 42. Doped region 41 is formed with a n-type dopant (e.g., phosphorus) that is ion implanted into polysilicon layer 26 and is used to enhance the electrical characteristics of polysilicon layer 26 as a conductive layer. Doped region 42 is formed such that a portion of the dopant extends below major surface 14 into pedestal 12, which is used to form source region 43 and drain region 44 (see FIG. 1). Note that a portion of doped region 42 also extends into plug regions 73, which only further serves to enhance the electrical characteristics of plug contacts 21 and 22. It should also be understood that the conductivity of plug contacts 21 and 22 could be doped to be of opposite conductivity if p-channel devices (not shown) are formed on semiconductor substrate 11. It should be noted that if plug contacts 73 are formed with polysilicon, then it may be necessary to implant plug contact 73 that makes electrical connection to well region 15 with dopant that is of the same conductivity type as well region 15 so as not to form a PN junction within plug contact 73.

In FIG. 8, only the areas of doped regions 41 and 42 in polysilicon layer 26 are shown. It should be understood that dopant will also enter portions of dielectric layer 28. A key feature of the implantation steps is that these steps are self-aligned to the source side of gate structure 20. This allows gate structure 20 to overlap source region 43 and drain region 44 after doped regions 41 and 42 have been annealed (as described below). This adds to device reliability and greatly enhances manufacturability.

An implant dose on the order of $1.0 \times 10^{15}$ atoms/cm$^2$ to $1.0 \times 10^{16}$ atoms/cm$^2$ and an implant energy on the order of 60 keV is suitable for forming doped region 41. An implant dose on the order of $1.0 \times 10^{15}$ atoms/cm$^2$ to $1.0 \times 10^{16}$ atoms/cm$^2$ and an implant energy on the order of 160 keV is suitable for forming doped region 42. Again, the dopant from the implantation step used to form region 42 extends into pedestal 12 and is used to form source region 43 and drain region 44 (see FIG. 1). Following ion implantation, the implanted dopant of doped regions 41 and 42 is activated using conventional rapid thermal anneal techniques to form source region 43 and drain region 44 as shown in FIG. 1. Preferably, source region 43 and drain region 44 are formed so they are elevated above surface 80 of substrate 11. An anneal of about 40 seconds at about 1050° C. is suitable. Alternatively, an equivalent furnace anneal is used. After the anneal, doped region 18 has a width of less than 0.3 microns, with a width on the order of 0.15 micron to about 0.25 micron being typical.

It should be noted that a photolithographic mask is used to prevent the dopant used to form doped regions 41 and 42 from entering into conductive structure 105 adjacent to gate structure 20.

Additionally, the same photolithographic mask can be used so that the portion of pedestal structure 12 between gate structure 20 and drain region 44 (see FIG. 1) is covered so as not to be doped with the implanted dopant. It should be appreciated that a reduction in the total number of photolithographic masking steps required to manufacture semiconductor device 10 can be consequently gained by delaying the formation of well region 15 until this point in the process so that the same mask is used for the formation of both drain region 44 and well region 15.

Referring now to FIG. 1, the final process steps of device 10 will be provided. Dielectric layer 40 is removed using a conventional wet etch process. Next, a spacer layer (not shown) is deposited onto gate structure 20, polysilicon layer 26, and dielectric layer 28 followed by a conventional reactive ion etch to form spacers 47 as shown in FIG. 1. The spacer layer preferably comprises silicon nitride, and the use of spacers 47 is optional and can be used in the formation of source electrode 71, drain electrode 72, and gate electrode 70.

Next, source electrode 71, drain electrode 72, and gate electrode 70 are formed using, for example, conventional self-aligned silicide techniques. Preferably, source electrode 71, drain electrode 72, and gate electrode 70 have a conductive layer 46 that is formed on all exposed surfaces of polysilicon layer 26 and polysilicon layer 38. Conductive layer 46 is formed to enhance the electrical properties of polysilicon layer 26 and polysilicon layer 38 and comprises titanium silicide, cobalt silicide, or the like. A portion of conductive layer 46 is also formed on conductive structure 105 adjacent to gate structure 20. However, conductive structure 105 is not used for the operation of semiconductor device 10.

In the embodiment shown in FIG. 1, the presence of drain extension region 101 and pedestal 12 allows semiconductor device 10 to deplete during operation so that the breakdown voltage of the device is significantly improved. For example, semiconductor device 10 can have a breakdown voltage in excess of 10 volts and preferably a breakdown voltage ranging from about 8 volts to 25 volts. Therefore, the present invention provides a device that has a relatively low threshold voltage, high noise immunity, and relatively high breakdown voltage.

Figure 9:
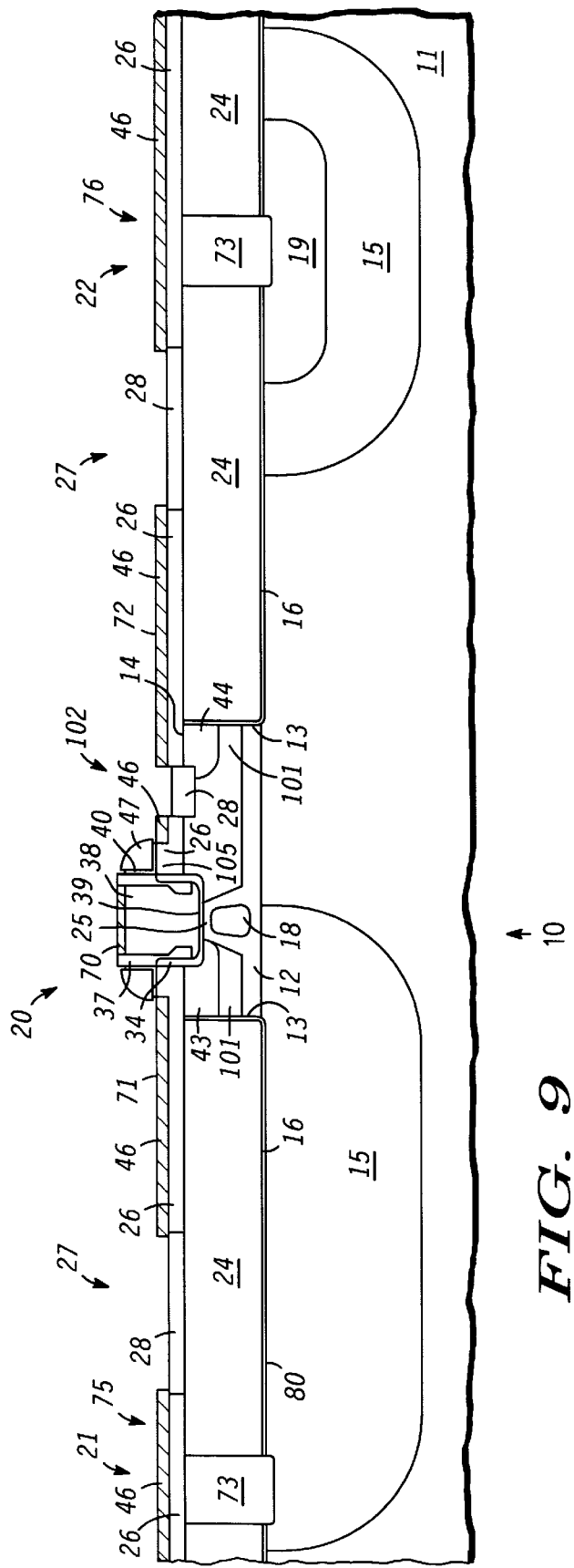
FIG. 9 illustrates an enlarged cross-sectional view of an alternate embodiment of the graded-channel semiconductor device of the present invention.

FIG. 9 illustrates an alternate embodiment of semiconductor device 10 according to the present invention. As described above with reference to FIG. 3, well region 15 was formed so as to extend completely under pedestal 12. This provides semiconductor device 10 with the characteristics described above. In FIG. 9, the formation of well region 15 is defined so as to not be under drain region 44. This further enhances the breakdown characteristics of semiconductor device 10. For example, in this alternative embodiment, semiconductor device 10 can have a breakdown voltage in excess of 15 volts and preferably has a breakdown voltage ranging from about 15 volts to 35 volts. The actual breakdown voltage can be varied depending in part on the size of pedestal 12 along with the doping concentration of semiconductor substrate 11, well region 15, and drain extension region 101.

To form well region 15 with the configuration shown in FIG. 9, a photolithographic mask (not shown) is formed prior to the ion implantation process used to form well region 15.

By now it should be appreciated that the present invention provides a graded-channel semiconductor device that offers many advantages over conventional semiconductor devices such as improved punch-through resistance, improved current densities at lower operating voltages, higher breakdown voltage, and improved manufacturability. These advantages provide for a device that has improved functionality with a lower manufacturing cost.

What is claimed is:

1. A semiconductor device comprising:
   a body of semiconductor material of a first conductivity type and having a surface;
   a pedestal on the surface of the body of semiconductor material, the pedestal having a major surface;
   a first doped region of a second conductivity type in the pedestal;
   a second doped region of the second conductivity type in the pedestal;
   a channel region between the first doped region and the second doped region;
   a third doped region of the first conductivity type in the pedestal, wherein the third doped region is vertically spaced apart from the major surface, and wherein the third doped region is vertically and laterally spaced apart from the first doped region and the second doped region and wherein the third doped region is spaced a distance of at least 125 angstroms from the major surface;
   a fourth doped region of the second conductivity type in the pedestal, wherein the fourth doped region overlaps a portion of the second doped region; and
   a gate structure overlying the channel region.

2. The semiconductor device of claim 1 wherein the third doped region has a dopant concentration that is at least an order of magnitude higher than that of the body of semiconductor material.

3. The semiconductor device of claim 1 wherein the third doped region is substantially centered between the first doped region and the second doped region.

4. The semiconductor device of claim 1 wherein the semiconductor device has a breakdown voltage ranging from about 10 volts to 35 volts.

5. The semiconductor device of claim 1 wherein the first doped region and the fourth doped region are elevated above the surface of the body of semiconductor material.

6. The semiconductor device of claim 1 wherein the pedestal has sides and the semiconductor device further comprises a dielectric layer along the sides of the pedestal.

7. A semiconductor device comprising:
   a body of semiconductor material of a first conductivity type and having a surface;
   a pedestal on the surface of the body of semiconductor material, the pedestal having a major surface;
   a well region that extends entirely under the pedestal;
   a first doped region of a second conductivity type in the pedestal;
   a second doped region of the second conductivity type in the pedestal;
   a channel region between the first doped region and the second doped region;
   a third doped region of the first conductivity type in the pedestal, wherein the third doped region is vertically spaced apart from the major surface, and wherein the third doped region is vertically and laterally spaced apart from the first doped region and the second doped region;
   a fourth doped region of the second conductivity type in the pedestal, wherein the fourth doped region overlaps a portion of the second doped region; and
   a gate structure overlying the channel region.

8. A semiconductor device comprising:
   a body of semiconductor material of a first conductivity type and having a surface;
   a pedestal on the surface of the body of semiconductor material, the pedestal having a major surface;
   a well region that extends only partially under the pedestal;
   a first doped region of a second conductivity type in the pedestal;
   a second doped region of the second conductivity type in the pedestal;
   a channel region between the first doped region and the second doped region;
   a third doped region of the first conductivity type in the pedestal, wherein the third doped region is vertically spaced apart from the major surface, and wherein the third doped region is vertically and laterally spaced apart from the first doped region and the second doped region;
   a fourth doped region of the second conductivity type in the pedestal, wherein the fourth doped region overlaps a portion of the second doped region; and
   a gate structure overlying the channel region.

9. The semiconductor device of claim 8 further comprising a plug structure that is electrically coupled to the well region, wherein the conductive material is a material selected from the group consisting of polysilicon, amorphous silicon, tungsten, cobalt, or titanium.

10. A semiconductor device comprising:
    a semiconductor substrate of a first conductivity type having a surface and a dopant concentration;
    a pedestal on the surface of the semiconductor substrate, the pedestal having a major surface;
    a source region of a second conductivity type in the pedestal and extending from the major surface;
    a drain region of the second conductivity type in the pedestal and extending from the major surface, wherein the source region and the drain region are above the surface of the semiconductor substrate;
    a drain extension region of the second conductivity type in the pedestal;
    a doped region of the first conductivity type in the pedestal, wherein the doped region has a dopant concentration that is higher than the dopant concentration of the semiconductor substrate;
    a gate structure overlying the pedestal and at least a portion of the doped region; and a conductive structure overlying the major surface of the pedestal between the gate structure and the drain region, wherein no portion of the drain region is under the conductive structure.

11. The semiconductor device of claim 10 wherein the dopant concentration of the semiconductor substrate is less than $2.0 \times 10^{16}$ atoms/cm$^3$.

12. The semiconductor device of claim 10 wherein the dopant concentration of the doped region is at least about $3.0 \times 10^{17}$ atoms/cm$^3$.

13. The semiconductor device of claim 10 wherein the pedestal has sides and the semiconductor device further comprises a dielectric layer formed along the sides of the pedestal.

14. The semiconductor device of claim 10 further comprising a well region that extends partially under the pedestal.

15. The semiconductor device of claim 10 further comprising a well region that extends completely under the pedestal.

16. The semiconductor device of claim 10 wherein the drain extension region extends across the pedestal.

17. A method for forming a semiconductor device comprising the steps of:

provides a body of semiconductor material having a first conductivity type and a dopant concentration;

forming a pedestal on the body of semiconductor material, the pedestal having a major surface;

forming a doped region of the first conductivity type in the pedestal, wherein the doped region is spaced apart from the major surface;

forming a gate structure on the major surface of the pedestal and overlying the doped region;

forming a drain extension region of a second conductivity type;

forming a source region in the pedestal, wherein the source region is of the second conductivity type, and wherein the source region is vertically and laterally spaced apart from the doped region;

forming a drain region in the pedestal, wherein the drain region overlaps a portion of the drain extension region; and forming a conductive structure overlying the major surface of the pedestal between the drain region and the gate structure, wherein no portion of the conductive structure is over the drain region.

18. The method of claim 17 wherein the step of forming the doped region includes the steps of:

forming a first dielectric layer overlying the major surface;

forming an opening in the first dielectric layer to expose a portion of the pedestal;

forming a second dielectric layer on the major surface of the pedestal;

forming spacers in the opening; and ion implanting dopant into the pedestal through the opening.

19. The method of claim 18 wherein the step of ion implanting includes a plurality of ion implants.

20. The method of claim 17 wherein the step of forming the gate structure includes the steps of:

forming a thermal oxide layer on the pedestal;

forming a dielectric layer overlying the pedestal;

forming an opening in the dielectric layer to provide an exposed portion of the pedestal, the opening having a width and a depth, the depth being greater than the width;

forming spacers in the opening; and forming a layer of conductive material in the opening and on the spacers.

21. The method of claim 17 further comprising the step of forming a well region in the body of semiconductor material, wherein a same photolithographic mask is used to form the drain region and the well region.

* * * * *